United States Patent
Kobayashi

(10) Patent No.: US 8,421,249 B2
(45) Date of Patent: Apr. 16, 2013

(54) EPOXY RESIN COMPOSITION FOR SEMICONDUCTOR ENCAPSULATION AND SEMICONDUCTOR DEVICE USING THE SAME

(75) Inventor: Hironori Kobayashi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 181 days.

(21) Appl. No.: 13/102,674

(22) Filed: May 6, 2011

(65) Prior Publication Data

US 2011/0272828 A1 Nov. 10, 2011

(30) Foreign Application Priority Data

May 10, 2010 (JP) ................................. 2010-108026

(51) Int. Cl.
*H01L 23/29* (2006.01)
(52) U.S. Cl.
USPC ........... 257/791; 257/774; 257/778; 257/787; 257/788; 257/789
(58) Field of Classification Search ......................... None
See application file for complete search history.

(56) References Cited

U.S. PATENT DOCUMENTS 6,774,501 B2 * 8/2004 Kurafuchi et al. ............ 257/788

FOREIGN PATENT DOCUMENTS

| JP | 08-151433 A | 6/1996 |
| JP | 2002-194064 A | 7/2002 |

* cited by examiner

*Primary Examiner* — Kyoung Lee
(74) *Attorney, Agent, or Firm* — Sughrue Mion, PLLC

(57) ABSTRACT

The present invention relates to an epoxy resin composition for semiconductor encapsulation, including the following ingredients A to E: A: an epoxy resin; B: a silicone mixture containing the following ingredients b1 and b2, with a weight ratio of the ingredients b1 and b2 being from 5/95 to 25/75 in terms of b1/b2: b1: a silicone compound having an amino group in both ends thereof and having a weight average molecular weight of from 600 to 900, and b2: a silicone compound having an amino group in both ends thereof and having a weight average molecular weight of from 10,000 to 20,000; C: a phenol resin; D: a curing accelerator; and E: an inorganic filler containing the following ingredients e1 and e2: e1: a crystalline silica, and e2: a fused silica.

10 Claims, 1 Drawing Sheet

EPOXY RESIN COMPOSITION FOR SEMICONDUCTOR ENCAPSULATION AND SEMICONDUCTOR DEVICE USING THE SAME

FIELD OF THE INVENTION

The present invention relates to an epoxy resin composition for semiconductor encapsulation, capable of not only suppressing the crack generation of a passivation film but also achieving resin encapsulation with excellent moldability at the time of the resin encapsulation of a semiconductor device having been subjected to a passivation treatment.

BACKGROUND OF THE INVENTION

In general, semiconductor devices are manufactured by encapsulating a semiconductor element protected by a surface protective film that is called a passivation film using an encapsulating resin in which an inorganic filler such as a silica powder is mixed with and dispersed in a thermosetting resin.

There may be the case where a crack is generated on the passivation film by a thermal stress of an encapsulating resin layer generated when conducting the resin encapsulation. In order to reduce the thermal stress, it has been investigated to add a flexible material such as a silicone compound as a stress reducing agent to the encapsulating resin (see Patent Documents 1 and 2).

Patent Document 1: JP-A-8-151433
Patent Document 2: JP-A-2002-194064

SUMMARY OF THE INVENTION

However, in the case of a semiconductor device in which an encapsulating resin layer is required to have thermal conductivity, such as a power transistor, it is necessary to increase the content of a crystalline silica powder having high thermal conductivity in the encapsulating resin layer with an increase of the thickness of the encapsulating resin layer itself Therefore, a linear expansion coefficient of the encapsulating resin layer increases. For that reason, a larger thermal stress is generated on the encapsulating resin layer, so that it was difficult to sufficiently reduce the thermal stress by using only a stress reducing agent.

Also, by adding the stress reducing agent, there was a tendency that problems in moldability, such as a lowering in flowability of the resin composition and a defective appearance, are caused.

Under such circumstances, the invention has been made, and an object thereof is to provide an epoxy resin composition for semiconductor encapsulation which is capable of not only suppressing the crack generation of a passivation film while keeping thermal conductivity but also achieving resin encapsulation with excellent moldability.

Namely, the present invention relates to the following items (1) to (6).

(1) An epoxy resin composition for semiconductor encapsulation, including the following ingredients A to E:
A: an epoxy resin;
B: a silicone mixture containing the following ingredients b1 and b2, with a weight ratio of the ingredients b1 and b2 being from 5/95 to 25/75 in terms of b1/b2:
  b1: a silicone compound having an amino group in both ends thereof and having a weight average molecular weight of from 600 to 900, and
  b2: a silicone compound having an amino group in both ends thereof and having a weight average molecular weight of from 10,000 to 20,000;
C: a phenol resin;
D: a curing accelerator; and
E: an inorganic filler containing the following ingredients e1 and e2:
  e1: a crystalline silica, and
  e2: a fused silica.

(2) An epoxy resin composition for semiconductor encapsulation, including a silicone-modified epoxy resin obtained by reacting the following ingredient A with the following ingredient B; and the following ingredients C to E:
A: an epoxy resin;
B: a silicone mixture containing the following ingredients b1 and b2, with a weight ratio of the ingredients b1 and b2 being from 5/95 to 25/75 in terms of b1/b2:
  b1: a silicone compound having an amino group in both ends thereof and having a weight average molecular weight of from 600 to 900, and
  b2: a silicone compound having an amino group in both ends thereof and having a weight average molecular weight of from 10,000 to 20,000;
C: a phenol resin;
D: a curing accelerator; and
E: an inorganic filler containing the following ingredients e1 and e2:
  e1: a crystalline silica, and
  e2: a fused silica.

(3) The epoxy resin composition for semiconductor encapsulation according to (1) or (2), in which the ingredient E is contained in an amount of from 70 to 93% by weight relative to the whole of the epoxy resin composition.

(4) The epoxy resin composition for semiconductor encapsulation according to any one of (1) to (3), in which a weight ratio of the ingredients e1 and e2 is from 45/55 to 75/25 in terms of e1/e2.

(5) The epoxy resin composition for semiconductor encapsulation according to any one of (1) to (4), further including the following ingredient F:
F: a wax mixture containing the following ingredients f1 and f2:
  f1: an amide wax, and
  f2: an ester wax.

(6) A semiconductor device comprising a semiconductor element encapsulated with the epoxy resin composition for semiconductor encapsulation according to any one of (1) to (5).

The epoxy resin composition for semiconductor encapsulation of the invention reduces a thermal stress generated at the time of resin encapsulation, so that it becomes possible to suppress the crack generation of a passivation film while keeping thermal conductivity and also possible to achieve resin encapsulation with excellent moldability.

DETAILED DESCRIPTION OF THE INVENTION

Figure 1:
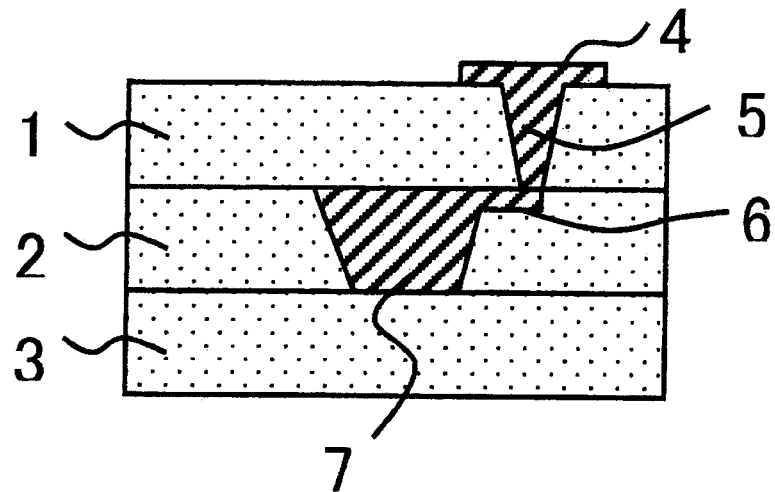
FIG. 1 is an explanatory view showing a molding method of an epoxy resin composition cured material to be used for an evaluation method of releasability.

Next, embodiments for carrying out the invention are described in detail.

The invention relates to an epoxy resin composition for semiconductor encapsulation, which including the following ingredients A to E.

A: an epoxy resin

B: a silicone mixture containing the following ingredients b1 and b2, with a weight ratio of the ingredients b1 and b2 being from 5/95 to 25/75 in terms of b1/b2
   b1: a silicone compound having an amino group in both ends thereof and having a weight average molecular weight of from 600 to 900
   b2: a silicone compound having an amino group in both ends thereof and having a weight average molecular weight of from 10,000 to 20,000

C: a phenol resin

D: a curing accelerator

E: an inorganic filler containing the following ingredients e1 and e2
   e1: a crystalline silica
   e2: a fused silica The epoxy resin that is the ingredient A is not particularly limited. For example, various epoxy resins such as a cresol novolak type epoxy resin, a triphenylmethane type epoxy resin, a biphenyl type epoxy resin, a modified bisphenol A type epoxy resin, a bisphenol A type epoxy resin, a bisphenol F type epoxy resin, a modified bisphenol F type epoxy resin, a dicyclopentadiene type epoxy resin, a phenol novolak type epoxy resin and a phenoxy resin can be used. Such an epoxy resin may be used alone or in combination of two or more kinds thereof From the viewpoint of ensuring reactivity of the epoxy resin and toughness of a cured material of the epoxy resin composition, epoxy resins having an epoxy equivalent of from 150 to 250 and a softening point or melting point of from 50 to 130° C., which are solid at room temperature, are preferable. Above all, from the viewpoint of reliability, it is preferable to use a cresol novolak type epoxy resin, a triphenylmethane type resin or a biphenyl type epoxy resin.

It is preferable that a content of the ingredient A is in the range of from 5 to 20% by weight relative to the whole of the epoxy resin composition.

The ingredient B is a silicone mixture containing the following ingredients b1 and b2 and having a weight ratio of the ingredients b1 and b2 of from 5/95 to 25/75 in terms of b1/b2.
   b1: a silicone compound having an amino group in the both ends thereof and having a weight average molecular weight of from 600 to 900
   b2: a silicone compound having an amino group in the both ends thereof and having a weight average molecular weight of from 10,000 to 20,000

By using the ingredient B, it is possible to achieve resin encapsulation with excellent moldability while suppressing a crack of a passivation film.

From the viewpoint of moldability, the ingredients b1 and b2 are used in a weight ratio of from 5/95 to 25/75 in terms of b1/b2. When the weight ratio of b1 is less than 5, there is a tendency that the flowability of the epoxy resin is lowered. Also, when the weight ratio of b1 exceeds 25, there is a tendency that a defective appearance such as package fogging is caused.

The weight average molecular weight of the ingredient b1 is from 600 to 900, preferably from 650 to 850, and more preferably from 700 to 800. When the weight average molecular weight of the ingredient b1 is less than 600, there is a tendency that a defective appearance such as package fogging is caused. When the weight average molecular weight of the ingredient b1 exceeds 900, there is a tendency that the flowability of the epoxy resin composition is lowered.

The weight average molecular weight of the ingredient b2 is from 10,000 to 20,000, preferably from 12,000 to 18,000, and more preferably from 14,000 to 16,000. When the weight average molecular weight of the ingredient b2 is less than 10,000, there is a tendency that the die releasability is lowered. When the weight average molecular weight of the ingredient b2 exceeds 20,000, there is a tendency that the compatibility with the epoxy resin composition is lowered.

In this connection, the weight average molecular weight of each of the ingredients b1 and b2 is measured by the gel permeation chromatographic analysis.

From the viewpoint of an elastic modulus of the epoxy resin composition, it is preferable that a blending amount of the ingredient B is from 3 to 20 parts by weight based on 100 parts by weight of the ingredient A.

In this connection, from the viewpoint of die releasability, it is preferable that after the ingredients A and B are reacted with each other to obtain a silicone-modified epoxy resin, the following ingredients C to E are added to the obtained silicone-modified epoxy resin, followed by melt kneading. On that occasion, a reaction condition is preferably from 165 to 185° C. for a heating temperature and from 10 to 50 minutes for a heating time, respectively.

The phenol resin that is the ingredient C is not particularly limited so far as it causes a curing reaction with the ingredient A. Examples of the phenol resin which can be used include a phenol novolak resin, a phenol aralkyl resin, a biphenyl aralkyl resin, a dicyclopentadiene type phenol resin, a cresol novolak resin and a resol resin. Such a phenol resin may be used alone or in combination of two or more kinds thereof. From the viewpoint of reactivity with the ingredient A, it is preferable to use a phenol resin having a hydroxyl group equivalent of from 70 to 250 and a softening point of from 50 to 110° C. Above all, from the viewpoint of high curing reactivity, a phenol novolak resin can be suitably used. Also, from the viewpoint of reliability, it is preferable to use a phenol resin with low hygroscopicity, such as a phenol aralkyl resin and a biphenyl aralkyl resin.

From the viewpoint of curing reactivity, the ingredient C is blended in such a manner that the blending amount thereof is preferably from 0.7 to 1.5 equivalents, and more preferably from 0.9 to 1.2 equivalents in terms of a total sum of hydroxyl groups in the ingredient C per one equivalent of the epoxy group in the ingredient A.

Although the curing accelerator that is the ingredient D is not particularly limited so far as it is able to allow the curing of the epoxy resin and the phenol resin to proceed, from the viewpoint of curing properties, it is preferable to use a diazabicycloalkene-based compound such as 1,8-diazabicyclo[5.4.0]undecene-7 and 1,5-diazabicyclo[4.3.0]nonene-5; an amine compound such as triethylamine and benzyldimethylamine; an organophosphorus-based compound such as triphenylphosphine and tetraphenylphosphonium tetraphenyl borate; or an imidazole compound. Such a curing accelerator may be used alone or in combination with other curing accelerator.

A content of the ingredient D is preferably from 0.3 to 1.5 parts by weight based on 100 parts by weight of the total content of the ingredients A and C.

Also, from the viewpoint of curing properties, it is preferable that the ingredient
D is melt mixed with the ingredient C in advance. On that occasion, a melt mixing condition is preferably from 160 to 230° C. for a heating temperature and from 1 to 5 hours for a heating time, respectively.

The ingredient E is an inorganic filler containing the following ingredients e1 and e2.

e1: a crystalline silica
e2: a fused silica

By using the ingredients e1 and e2 in combination, it is possible to provide an epoxy resin composition with excellent flowability while keeping thermal conductivity.

The ingredient e1 is crystalline silica. As the ingredient e1, one obtained by pulverizing natural quartz can be used, and in general, although it has a sharp shape, it may be processed so as to have a rounded shape by polishing. Above all, one having an average particle size of from 1 to 50 μm is preferably used, and one having an average particle size of from 5 to 20 μm is more preferably used.

The ingredient e2 is fused silica. Examples of the ingredient e2 include a spherical fused silica powder and a crushed fused silica powder. From the viewpoint of flowability, it is preferable to use a spherical fused silica powder. Above of all, one having an average particle size of from 1 to 50 μm is preferably used, and one having an average particle size of from 5 to 30 μm is more preferably used.

In this connection, the foregoing average particle size can be, for example, drawn through the measurement by using a sample which is arbitrarily extracted from a mother population and using a laser diffraction/scattering particle size distribution analyzer.

From the viewpoint of a defective appearance such as package fogging, a weight ratio of the ingredients e1 and e2 is preferably from 45/55 to 75/25 in terms of e1/e2.

Also, a content of the ingredient E is preferably from 70 to 93% by weight, and more preferably from 75 to 87% by weight relative to the whole of the epoxy resin composition.

Furthermore, in the invention, it is preferable to use, as a release agent, an ingredient F that is a wax mixture containing the following ingredients f1 and f2. By using the ingredients f1 and f2 in combination, it is possible to more enhance the die releasability of a cured material of the epoxy resin composition.

f1: an amide wax
f2: an ester wax

The amide wax that is the ingredient f1 is a reaction product between a higher aliphatic acid and a polyvalent amine and is not particularly limited. Examples thereof include methylene bislauric acid amide, methylene bispalmitic acid amide, ethylene bisstearic acid amide, methylene bismyristic acid amide, ethylene bismyristic acid amide, ethylene bispalmitic acid amide, methylene bisbehenic acid amide and ethylene bisbehenic acid amide. Such an amide wax may be used alone or in combination of two or more kinds thereof. Above all, from the viewpoint of releasability, an amide wax using a higher aliphatic acid having from 17 to 50 carbon atoms is preferable.

The ester wax that is the ingredient f2 is a reaction product between a higher aliphatic acid and a polyhydric alcohol and is not particularly limited. Examples thereof include a montanic acid ester wax and a carnauba wax. Such an ester wax may be used alone or in combination of two or more kinds thereof. Above all, from the viewpoint of releasability, an ester wax using a higher aliphatic acid having from 17 to 50 carbon atoms is preferable.

From the viewpoints of adhesiveness between the epoxy resin composition and the passivation film and die releasability, a weight ratio of the ingredients f1 and f2 is preferably from 20/80 to 80/20 in terms of f1/f2.

Also, a content of the ingredient F is preferably from 0.1 to 1% by weight, and more preferably from 0.3 to 0.6% by weight relative to the whole of the epoxy resin composition.

In this connection, the epoxy resin composition for semiconductor encapsulation of the invention can be properly blended with, in addition to the foregoing ingredients A to F, other additives such as a flame retardant and a pigment including carbon black, if desired.

The epoxy resin composition for semiconductor encapsulation of the invention can be, for example, manufactured in the following manner. That is, the desired epoxy resin composition for semiconductor encapsulation can be manufactured by properly blending the foregoing ingredients A to E and optionally, the ingredient F and other additives according to the conventional method and melt-kneading them in a heated state using a kneader such as a mixing roll.

In this connection, as described previously, from the viewpoint of die releasability, it is preferable that after the ingredients A and B are allowed to react with each other to obtain a silicone-modified epoxy resin, the obtained silicone-modified epoxy resin is melt-kneaded with other ingredients.

As the epoxy resin composition for semiconductor encapsulation of the invention, an epoxy resin composition obtained by pulverization and tabletization according to the conventional method may be used, an epoxy resin composition in a powdered form may be used as it is without being tableted, or an epoxy resin composition formed into a sheet shape may be used.

The encapsulation of a semiconductor element using the thus obtained epoxy resin composition for semiconductor encapsulation is not particularly limited, and it can be achieved by a known molding method such as usual transfer molding (inclusive of transfer underfill), compression molding and sheet encapsulation.

EXAMPLES

Next, Examples are described together with Comparative Examples. However, it should not be construed that the invention is limited to these Examples.

First of all, the following respective ingredients were prepared.

[Epoxy Resin]

Cresol novolak type epoxy rein (KI-3000, manufactured by Toto Kasei Co., Ltd., softening point: 70° C., epoxy equivalent: 105)

[Silicone Compound X (Corresponding to the Foregoing Ingredient b1)]

Amino group-containing polydimethylsiloxane (L655, manufactured by Wacker Asahikasei Silicone Co., Ltd., weight average molecular weight: 800)

[Silicone Compound Y (Corresponding to the Foregoing Ingredient b2)]

Amino group-containing polydimethylsiloxane (L652, manufactured by Wacker Asahikasei Silicone Co., Ltd., weight average molecular weight: 12,000)

[Silicone Compound Z]

Amino group-containing polydimethylsiloxane (SF-8417, manufactured by Dow Corning Toray Co., Ltd., weight average molecular weight: 25,000)

[Silicone-modified Epoxy Resins I to IV]

The epoxy resin, the silicone compound X and the silicone compound Y were allowed to react with each other in a proportion shown in Table 1 at 220° C. for 2 hours, thereby obtaining silicone-modified epoxy resins I to IV.

[Phenol Resin]

Phenol novolak resin (GS-180, manufactured by Gunei Chemical Industry Co., Ltd., hydroxyl group equivalent: 109, softening point: 70° C.)

[Curing Accelerator]

1,8-Diazabicyclo[5.4.0]undecene-7

[Inorganic Filler X (Corresponding to the Foregoing Ingredient e1)]

Crystalline silica powder having an average particle size of 30 μm and a maximum particle size of 128 μm (FB-9454, manufactured by Denki Kagaku Kogyo Kabushiki Kaisha)

[Inorganic Filler Y (Corresponding to the Foregoing Ingredient e2)]

Fused silica powder having an average particle size of 15 μm and a maximum particle size of 128 μm (FB-9454FC, manufactured by Denki Kagaku Kogyo Kabushiki Kaisha)

[Inorganic Filler Z (Corresponding to the Foregoing Ingredient e2)]

Fused silica powder having an average particle size of 22 μm and a maximum particle size of 128 μm (FB-820, manufactured by Denki Kagaku Kogyo Kabushiki Kaisha)

[Release Agent X (Corresponding to the Foregoing Ingredient f1)]

Amide wax (Kao Wax EB-FF, manufactured by Kao Corporation)

[Release Agent Y (Corresponding to the Foregoing Ingredient f2)]

Montanic acid partially saponified ester wax (Licowax (registered trademark) OP, manufactured by Clariant)

[Release Agent Z (Corresponding to the Foregoing Ingredient f2)]

Carnauba wax

Examples 1 to 7 and Comparative Examples 1 to 4

The respective ingredients shown in the following Tables 2 and 3 were blended in proportions shown in the same tables and melt-kneaded at 100° C. for 3 minutes using a roll kneader, thereby preparing epoxy resin compositions.

[Fabrication of Semiconductor Device]

Each of the obtained epoxy resin compositions was subjected to transfer molding at 175° C. for 120 seconds using a copper-made lead frame for 80-pin QFP and then post-cured at 175° C. for 5 hours to fabricate a semiconductor device. A chip has a size of 7.5 mm×7.5 mm×0.37 mm in thickness; a package has a size of 14 mm×20 mm×2.7 mm in thickness; and a passivation film made of a polyimide is provided.

[Appearance]

The appearance of each of the obtained semiconductor devices was visually inspected and evaluated as follows. That is, the case where fogging was observed on the package is designated as "B", and the case where fogging was not observed on the package is designated as "A". The results are shown in Tables 2 and 3.

[Suppression of Crack of Passivation Film]

Each of the obtained semiconductor devices was subjected to repetition of a thermal cycle at −65° C. for 5 minutes and then at 150° C. for 5 minutes of 1,000 times and then evaluated as follows. That is, the case where the generation of a crack was observed on the passivation film by visual inspection is designated as "C"; the case where although a crack was not observed on the passivation film by visual inspection, peeling was observed by a scanning acoustic tomograph is designated as "B"; and the case where a change was not observed on the passivation film in any of the foregoing inspections. The results are shown in Tables 2 and 3.

[Thermal Conductivity]

Each of the obtained epoxy resin compositions was subjected to transfer molding at 175° C. for 2 minutes and then post-cured at 175° C. for 5 hours in a dryer to fabricate a molded article having a size of 50 mm in diameter×1 mm in thickness and serving as a disc-shaped specimen. A coefficient of thermal conductivity of this molded article was measured using a thermal conductivity measurement system (KEMTHERMO QTM-D3, manufactured by Kyoto Electronics Manufacturing Co., Ltd.). Then, the thermal conductivity was evaluated as follows. That is, the case where the coefficient of thermal conductivity was 2.5 or more is designated as "A"; the case where the coefficient of thermal conductivity was 2.0 or more and less than 2.5 is designated as "B"; the case where the coefficient of thermal conductivity was 1.5 or more and less than 2.0 is designated as "C"; and the case where the coefficient of thermal conductivity was less than 1.5 is designated as "D". The results are shown in Tables 2 and 3.

[Flowability]

A spiral flow value (cm) was measured using a die for spiral flow measurement under a condition at 175±5° C. for 120 seconds under 70 kg/cm$^2$ according to the method of EMMI 1-66. The flowability was evaluated as follows. The case where the spiral flow value was 120 cm or more is designated as "A"; the case where the spiral flow value was 100 cm or more and less than 120 cm is designated as "B"; and the case where the spiral flow value was less than 100 cm is designated as "C". The results are shown in Tables 2 and 3.

[Die Releasability]

Figure 2:
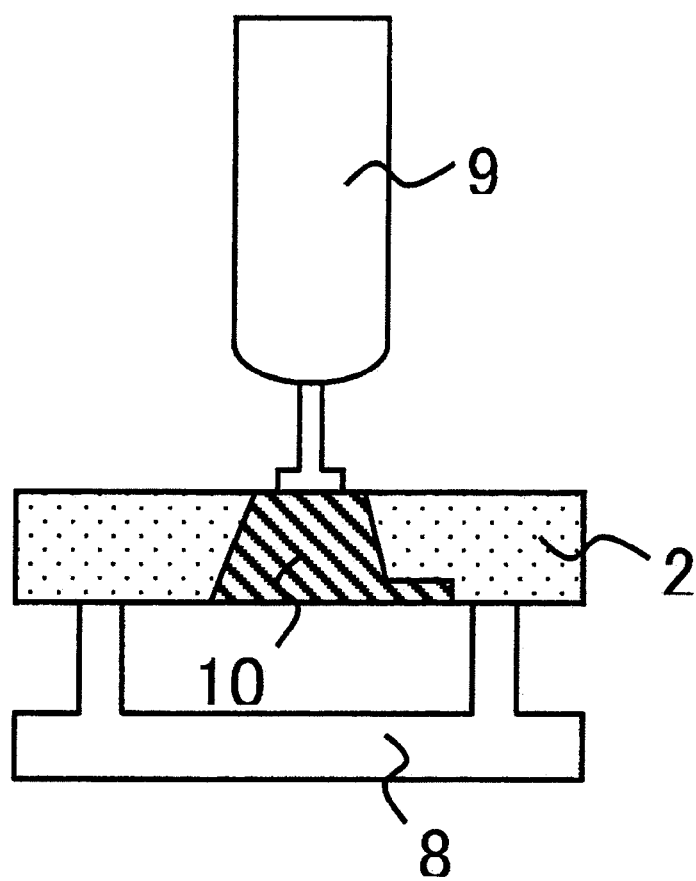
FIG. 2 is an explanatory view showing a measurement method of a release load that is an evaluation method of releasability.

First of all, molding was carried out using a molding die having a three-layered structure (upper die 1, central die 2 and lower die 3) shown in FIG. 1 under a condition at 175° C. for 60 seconds, and a load at the time of release in an epoxy resin composition cured material was measured. In FIG. 1, 4 represents a cull; 5 represents a sprue; 6 represents a runner; and 7 represents a cavity. As shown in FIG. 2, the measurement of a load at the time of release was carried out by placing the central die 2 of the molding die on a support table 8 and demolding an epoxy resin composition cured material 10 in the central die 2 from the upper part using a push-pull gauge 9. A load value at that time was measured and evaluated as follows. That is, the case where the load value was less than 14.7 N is designated as "A"; the case where the load value was 14.7 N or more and less than 19.6 N is designated as "B"; and the case where the load value was 19.6 N or more is designated as "C". The results are shown in Tables 2 and 3.

TABLE 1

| Composition | | Silicone-modified epoxy resin | | | |
|---|---|---|---|---|---|
| (% by weight) | | I | II | III | IV |
| Epoxy resin | | 92 | 95 | 85 | 90 |
| Silicone compound | X | 1 | 1 | 1 | 3 |
| | Y | 7 | 4 | 14 | 7 |

TABLE 2

| | | Example | | | | | | |
|---|---|---|---|---|---|---|---|---|
| | | 1 | 2 | 3 | 4 | 5 | 6 | 7 |
| Composition (% by weight) | | | | | | | | |
| Epoxy resin | | 9.5 | 9.5 | 9.5 | 9.5 | — | — | — |
| Silicone compound | X | 0.1 | 0.1 | 0.1 | 0.1 | — | — | — |

TABLE 2-continued

|  |  | Example 1 | Example 2 | Example 3 | Example 4 | Example 5 | Example 6 | Example 7 |
|---|---|---|---|---|---|---|---|---|
|  | Y | 0.7 | 0.7 | 0.7 | 0.7 | — | — | — |
|  | Z | — | — | — | — | — | — | — |
| Silicone-modified epoxy resin | I | — | — | — | — | 10.3 | — | — |
|  | II | — | — | — | — | — | 10.3 | — |
|  | III | — | — | — | — | — | — | 10.3 |
|  | IV | — | — | — | — | — | — | — |
| Phenol resin |  | 6.6 | 6.6 | 6.6 | 6.6 | 6.6 | 6.6 | 6.6 |
| Curing accelerator |  | 0.2 | 0.2 | 0.2 | 0.2 | 0.2 | 0.2 | 0.2 |
| Inorganic filler | X | 49.5 | 49.5 | 49.5 | 49.5 | 49.5 | 41.2 | 57.7 |
|  | Y | 33.0 | 33.0 | — | 33.0 | — | — | 24.7 |
|  | Z | — | — | 33.0 | — | 33.0 | 41.2 | — |
| Release agent | X | 0.4 | 0.3 | 0.3 | 0.3 | 0.3 | 0.2 | 0.1 |
|  | Y | — | 0.1 | 0.1 | — | 0.1 | 0.2 | 0.3 |
|  | Z | — | — | — | 0.1 | — | — | — |
| b1/b2 |  | 12.5/87.5 | 12.5/87.5 | 12.5/87.5 | 12.5/87.5 | 12.5/87.5 | 20/80 | 6.7/93.3 |
| Evaluation |  |  |  |  |  |  |  |  |
| Suppression of crack of passivation film |  | A | A | A | A | A | A | A |
| Thermal conductivity |  | B | B | B | B | B | B | B |
| Flowability |  | B | B | B | B | A | A | B |
| Die releasability |  | B | B | B | B | A | A | A |
| Appearance |  | A | A | A | A | A | A | A |

TABLE 3

|  |  | Comparative Example 1 | Comparative Example 2 | Comparative Example 3 | Comparative Example 4 |
|---|---|---|---|---|---|
| Composition (% by weight) |  |  |  |  |  |
| Epoxy resin |  | 9.5 | 9.5 | — | 9.5 |
| Silicone compound | X | 0.1 | — | — | — |
|  | Y | 0.7 | 0.7 | — | 0.8 |
|  | Z | — | 0.1 | — | — |
| Silicone-modified epoxy resin | I | — | — | — | — |
|  | II | — | — | — | — |
|  | III | — | — | — | — |
|  | IV | — | — | 10.3 | — |
| Phenol resin |  | 6.6 | 6.6 | 6.6 | 6.6 |
| Curing accelerator |  | 0.2 | 0.2 | 0.2 | 0.2 |
| Inorganic filler | X | 82.5 | 49.5 | 49.5 | 49.5 |
|  | Y | — | 33.0 | — | 33.0 |
|  | Z | — | — | 33.0 | — |
| Release agent | X | 0.4 | 0.4 | 0.2 | 0.4 |
|  | Y | — | — | — | — |
|  | Z | — | — | 0.2 | — |
| b1/b2 |  | 12.5/87.5 | — | 30/70 | 0/100 |
| Evaluation |  |  |  |  |  |
| Suppression of crack of passivation film |  | A | A | A | A |
| Thermal conductivity |  | A | B | B | B |
| Flowability |  | C | C | B | C |
| Die releasability |  | B | B | B | B |
| Appearance |  | B | B | B | B |

It is noted from the foregoing results that the epoxy resin compositions for semiconductor encapsulation of the invention reveal favorable results in all of the evaluation items, in particular, in Examples 5 to 7 which are concerned with a silicone-modified epoxy resin obtained by reacting the epoxy resin with the specified silicone compound in advance, the die releasability is more favorable. On the other hand, in Comparative Example 1 not containing the specified inorganic filler, Comparative Examples 2 and 4 not containing the specified silicone compound and Comparative Example 3 in which the weight ratio of the specified silicone compound does not satisfy the condition of the invention, although the crack of the passivation film is suppressed, there are defects in other evaluation items.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2010-108026 filed on May 10, 2010, and the contents are incorporated herein by reference.

All references cited herein are incorporated by reference herein in their entirety.

Also, all the references cited herein are incorporated as a whole.

The epoxy resin composition for semiconductor encapsulation of the invention reduces a thermal stress generated at the time of resin encapsulation, so that it becomes possible to suppress the crack generation of a passivation film while keeping thermal conductivity and also possible to achieve resin encapsulation with excellent moldability.

| Description of Reference Numerals and Signs |  |
|---|---|
| 1: | Upper die |
| 2: | Central die |
| 3: | Lower die |
| 4: | Cull |
| 5: | Sprue |
| 6: | Runner |
| 7: | Cavity |
| 8: | Support table |
| 9: | Push-pull gauge |
| 10: | Epoxy resin composition cured material |

What is claimed is:

1. An epoxy resin composition for semiconductor encapsulation, comprising the following ingredients A to E:
   A: an epoxy resin;
   B: a silicone mixture containing the following ingredients b1 and b2, with a weight ratio of the ingredients b1 and b2 being from 5/95 to 25/75 in terms of b1/b2:
      b1: a silicone compound having an amino group in both ends thereof and having a weight average molecular weight of from 600 to 900, and b2: a silicone compound having an amino group in both ends thereof and having a weight average molecular weight of from 10,000 to 20,000;

C: a phenol resin;

D: a curing accelerator; and

E: an inorganic filler containing the following ingredients e1 and e2:

e1: a crystalline silica, and e2: a fused silica.

2. The epoxy resin composition for semiconductor encapsulation according to claim 1, wherein the ingredient E is contained in an amount of from 70 to 93% by weight relative to the whole of the epoxy resin composition.

3. The epoxy resin composition for semiconductor encapsulation according to claim 1, wherein a weight ratio of the ingredients e1 and e2 is from 45/55 to 75/25 in terms of e1/e2.

4. The epoxy resin composition for semiconductor encapsulation according to claim 1, further comprising the following ingredient F:

F: a wax mixture containing the following ingredients f1 and f2:

f1: an amide wax, and f2: an ester wax.

5. A semiconductor device comprising a semiconductor element encapsulated with the epoxy resin composition for semiconductor encapsulation according to claim 1.

6. An epoxy resin composition for semiconductor encapsulation, comprising a silicone-modified epoxy resin obtained by reacting the following ingredient A with the following ingredient B; and the following ingredients C to E:

A: an epoxy resin;

B: a silicone mixture containing the following ingredients b1 and b2, with a weight ratio of the ingredients b1 and b2 being from 5/95 to 25/75 in terms of b1/b2:

b1: a silicone compound having an amino group in both ends thereof and having a weight average molecular weight of from 600 to 900, and b2: a silicone compound having an amino group in both ends thereof and having a weight average molecular weight of from 10,000 to 20,000;

C: a phenol resin;

D: a curing accelerator; and

E: an inorganic filler containing the following ingredients e1 and e2:

e1: a crystalline silica, and e2: a fused silica.

7. The epoxy resin composition for semiconductor encapsulation according to claim 6, wherein the ingredient E is contained in an amount of from 70 to 93% by weight relative to the whole of the epoxy resin composition.

8. The epoxy resin composition for semiconductor encapsulation according to claim 6, wherein a weight ratio of the ingredients e1 and e2 is from 45/55 to 75/25 in terms of e1/e2.

9. The epoxy resin composition for semiconductor encapsulation according to claim 6, further comprising the following ingredient F:

F: a wax mixture containing the following ingredients f1 and f2:

f1: an amide wax, and f2: an ester wax.

10. A semiconductor device comprising a semiconductor element encapsulated with the epoxy resin composition for semiconductor encapsulation according to claim 6.

* * * * *